United States Patent [19]

Masujima et al.

[11] 4,346,537
[45] Aug. 31, 1982

[54] CAPACITOR TRIMMING SYSTEM IN A QUARTZ-CRYSTAL OSCILLATOR

[75] Inventors: Sho Masujima, Tokyo; Shoichi Iwaya, Kasagata, both of Japan

[73] Assignee: TDK Electronics Co., Ltd., Tokyo, Japan

[21] Appl. No.: 97,900

[22] Filed: Nov. 27, 1979

[30] Foreign Application Priority Data

Nov. 30, 1978 [JP] Japan .................................. 53-148469

[51] Int. Cl.³ ........................ B24C 3/32; H01G 1/015
[52] U.S. Cl. ........................................ 51/413; 29/593; 361/271; 361/304; 331/158
[58] Field of Search ................. 51/319, 413; 29/25.35, 29/25.42, 593; 361/271, 304; 331/44, 116 R, 158, 177, 179 R

[56] References Cited

U.S. PATENT DOCUMENTS

| | | | |
|---|---|---|---|
| 2,758,256 | 8/1956 | Ersler | 338/328 X |
| 3,665,570 | 5/1972 | Brooks | 51/319 |
| 3,681,664 | 8/1972 | Metzger | 29/25.42 X |
| 3,688,361 | 9/1972 | Bonini | 29/593 X |
| 3,808,752 | 5/1974 | Beaver | 51/319 |
| 3,947,934 | 4/1976 | Olson | 29/593 X |
| 4,063,910 | 12/1977 | Huguenin | 51/413 |
| 4,184,062 | 1/1980 | Schmidt | 29/593 |
| 4,190,854 | 2/1980 | Redfern | 361/271 X |
| 4,224,547 | 9/1980 | Miller | 29/25.35 X |

FOREIGN PATENT DOCUMENTS 2412925  8/1979  France ........................ 29/25.42

OTHER PUBLICATIONS

"Capacitor Trimmer, MT-110" (Catalogue), Comco Inc., USA-3/77.

Primary Examiner—Nicholas P. Godici
Attorney, Agent, or Firm—Armstrong, Nikaido, Marmelstein & Kubovcik

[57] ABSTRACT

A capacitor trimming system for a quartz-crystal oscillator in a watch and/or a clock for providing a punctual watch and/or a clock has been found. The system comprises an oscillation circuit including at least a quartz-crystal piece, a trimmer capacitor for adjusting the oscillating frequency of the quartz-crystal piece, a semiconductor electronic circuit for operating said quartz-crystal piece, and apparatus for adjusting automatically the trimmer capacitor so that the oscillating frequency becomes the same as the desired reference frequency. The trimmer capacitor comprises of at least a fixed outer trimming electrode, an inner common electrode fixed parallel to said trimming electrode and a dielectric body sandwiched between the two electrodes. The trimming electrode is disposed in the air for enabling the trimming of the area of the trimming electrode, and the trimming electrode has a coarse adjustment portion parallel and aligned with said common electrode and a fine adjustment portion attached to the same plane of that of the coarse adjustment portion but outside of the common electrode. The oscillation frequency of the quartz-crystal piece is automatically picked up and the frequency is compared with the desired reference frequency, and according to the result of the comparison, the trimming electrode is trimmed so that the oscillating frequency becomes the desired reference frequency. The trimming is carried out first for the coarse trimming portion, and secondly for the fine adjustment portion.

4 Claims, 12 Drawing Figures

CAPACITOR TRIMMING SYSTEM IN A QUARTZ-CRYSTAL OSCILLATOR

BACKGROUND OF THE INVENTION

The present invention relates to a capacitor trimming system in particular, relates to such a system for trimming a capacitor in a quartz-crystal oscillator.

One of the applications of the capacitor trimmed by the present invention is wrist watch assemblies and/or clock assemblies which are electrically operable and which contain a printed circuit board within a watch case wherein a trimmer capacitor is provided to enable the tuning of an oscillating circuit which, in turn, suitably adjusts the timing mechanism. In view of the design of the watch cases, it will be readily understood that the thickness of the printed circuit panel and the height of components atop the panel must be held to a minimum.

A prior trimmer capacitor for the above applications is shown in U.S. Pat. No. 3,681,664, in which a stator electrode and a rotor electrode parallel to said stator electrode are arranged with suitable dielectric body therebetween. By rotating the rotor electrode, the capacitance is adjusted for the optimum operation of a watch.

However, said prior trimmer capacitor has the disadvantages that the size is not enough small, the capacitance is not stable due to the presence of the mechanical adjustment means, and the adjustment operation can not be automatic but must be carried out by a skilled person. In particular, the lack of the stableness is the important disadvantages since it deteriorates the accuracy of a watch, and that disadvantage is inevitable because of the mechanical structure of said trimmer capacitor. Further, the mechanically adjusted capacitance is apt to change by an external vibration, and then causes the deterioration of the reliability and/or the frequency stability of a watch.

SUMMARY OF THE INVENTION

It is an object, therefore, of the present invention to overcome the disadvantages and limitations of a prior capacitor trimming system by providing a new and improved capacitor trimming system.

The above and other objects are attained by a capacitor trimming system comprising an oscillation circuit including at least a quartz-crystal piece, a trimmer capacitor for adjusting the oscillating frequency of the quartz-crystal piece, a semiconductor electronic circuit for operating said quartz-crystal piece, and adjusting means for adjusting automatically said trimmer capacitor so that the oscillating frequency becomes the same as the desired reference frequency. The trimmer capacitor comprises at least a fixed outer trimming electrode, an inner common electrode fixed parallel and aligned to said trimming electrode and a dielectric body sandwiched between said two electrodes, at least said trimming electrode being disposed in the air for enabling the trimming of the area of the trimming electrode, said trimming electrode having a coarse adjustment portion parallel and aligned with said common electrode and a fine adjustment portion attached to the same plane as that of the coarse adjustment portion but outside of said common electrode. Said adjusting means is acoustically coupled with the quartz-crystal piece to measure and compare the oscillating frequency of the quartz-crystal piece with the desired reference frequency, and according to the difference between the oscillating frequency of the quartz-crystal piece and the reference frequency, the trimming electrode of the trimming capacitor is trimmed. The trimming is performed at first for the coarse adjustment portion, and next for the fine adjustment portion.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
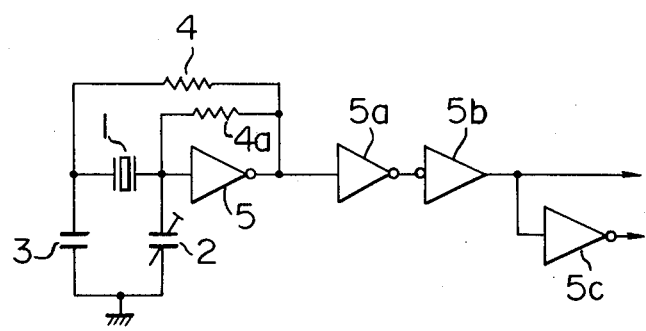
FIG. 1 is the circuit diagram of a quartz-crystal oscillator utilizing the present trimmer capacitor.

FIG. 1 shows the block diagram of a quartz-crystal oscillator, in which the reference numeral 1 is a quartz-crystal piece, 2 is a trimmer capacitor, 3 is a fixed capacitor, 4 and 4a are resistors, 5 is a semiconductor amplifier. The high frequency signal at the output of the amplifier 5 is supplied to another circuits through buffer amplifiers 5a, 5b and 5c. The oscillating frequency of the oscillator is adjusted finely by adjusting the trimmer capacitor 2. Of course it should be appreciated that another oscillating circuit utilizing a quartz-crystal piece is possible for applying the present invention.

Figure 2:
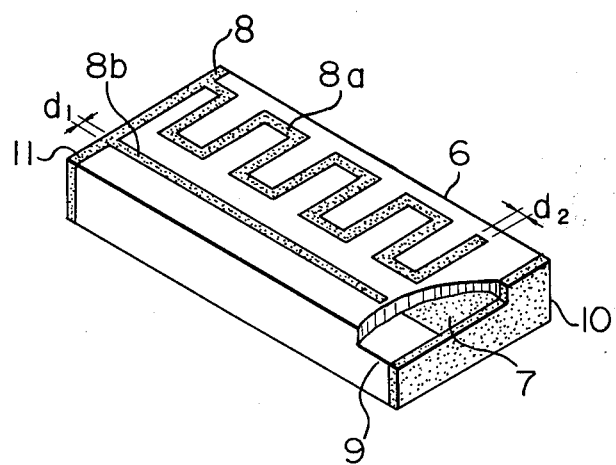
FIG. 2 is the perspective view of the capacitor which is to be trimmed by the present apparatus.
Figure 3:
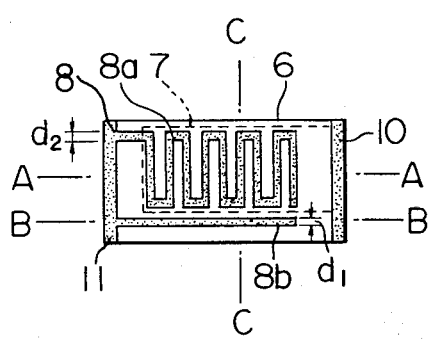
FIG. 3 is the plane view of the capacitor in FIG. 2.
Figure 4:
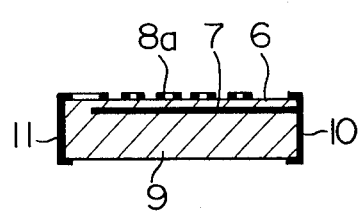
FIG. 4 is the cross sectional view on the line A—A of FIG. 3.
Figure 5:
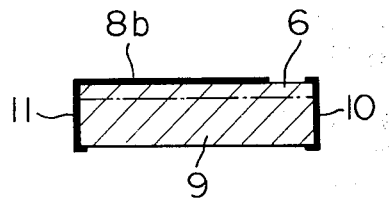
FIG. 5 is the cross sectional view on the line B—B of FIG. 3.
Figure 6:
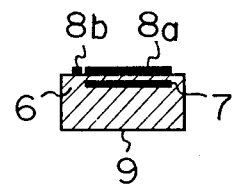
FIG. 6 is the cross sectional view on the line C—C of FIG. 4.

FIG. 2 shows the perspective view of the present trimmer capacitor which is to be trimmed, FIG. 3 is the plane view of the capacitor in FIG. 2, FIG. 4 is the cross sectional view on the line A—A of FIG. 3, FIG. 5 is the cross sectional view on the line B—B of FIG. 3, and FIG. 6 is the cross sectional view of the line C—C of FIG. 3. In those figures, the reference numeral 6 is a ceramic dielectric body, which is manufactured by sintering the elastic sheet of the material of the thickness 50-100 $\mu$m at the temperature 1,100°-1,400° C. Said material is for instance Barium-titanate or Titanium-oxide. 7 is an inner common electrode. The material of the inner electrode 7 is a paste of noble metals like platinum, palladium, or silver-palladium alloy. Said paste is printed on a dielectric body 6 before sintering through a silk-screen method and the desired pattern of the inner common electrode is obtained. 8 is the outer trimming electrode disposed in the air on the surface of the dielectric body 6 and said outer trimming electrode 8 confronts with said inner common electrode 7. Said outer trimming electrode 8 comprises the first portion 8a which is utilized for the coarse adjustment of the capacitance, and the second portion 8b which is utilized for the fine adjustment of the capacitance. The coarse adjustment portion 8a has the folded linear pattern or the zigzag pattern like a cumb line and has a plurality of parallel lines with a predetermined duration so that the total length of the pattern is sufficiently long. The fine adjustment portion 8b has only a single linear pattern as shown in the drawings. The width ($d_1$) of the fine adjustment portion 8b is narrower than the width ($d_2$) of the coarse adjustment portion 8a so that the change of the capacitance by the trimming of the fine adjustment portion 8b is smaller than that of the coarse adjustment portion 8a, thus, a precise and accurate trimming is possible by a fine adjustment portion 8b.

It should be appreciated in FIG. 6 that the fine adjustment portion 8b is on the same plane as that of the coarse adjustment portion 8a, but said fine adjustment portion 8b is mounted outside of the common electrode 7. Accordingly, the capacitance between the fine adjustment portion 8b and the common electrode 7 is considerably small, and the change of the capacitance by the trimming of the unit length of the fine adjustment portion is sufficiently small. Therefore, very fine adjustment of the capacitance or the oscillating frequency is possible by trimming the fine adjustment portion. The structure that the fine adjustment portion 8b does not directly align with the common electrode as shown in FIG. 6 is one of the features of the present invention. According to the embodiment, 90% of the capacitance of the trimmer capacitor is provided by the coarse adjustment portion and 10% of the capacitance is by the fine adjustment portion.

The reference numeral 9 shows a support means, which is composed of the same material as that of the dielectric body 6 so that the support means attach to the dielectric body well in the sintering process. Alternatively, said support means is made of the strong porcelain with small dielectric constant, like $Al_2O_3$, steatite porcelain, or forsterite series porcelain. The support means 9 is laminated on the dielectric body 6 and those laminated assembly is sintered at the same time. The laminated structure of said support means and the dielectric body has the advantage that a capacitor with a small size and a large capacitance is obtained since we can use the sufficiently thin dielectric body which is mechanically weak but provides the large capacitance, by utilizing the support means which strengthen the dielectric body.

The reference numerals 10 and 11 are terminals for external connections, and are electrically connected to the inner electrode 7 and the outer electrode 8, respectively. The pattern of those terminals 10 and 11 is painted at the sides of the laminated assembly of the dielectric body 6 and the support means 9, and is sintered at the same time as the sintering of the laminated assembly itself. The material of that terminals is for instance silver paint including flint.

Figure 7:
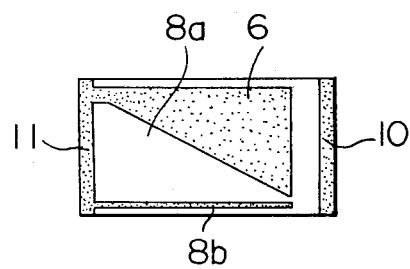
FIG. 7 is the plane view of another capacitor to be trimmed.

FIG. 7 shows the alternate pattern of the outer electrode 8 (8a and 8b), in which a triangular pattern is utilized for the coarse adjustment portion, instead of said zigzag pattern in FIG. 3.

The capacitor as shown in FIGS. 3 through 6, or FIG. 7 is put on the printed circuit which has the circuit components shown in FIG. 1, and the capacitor is connected to the circuit through the terminals 10 and 11 by utilizing conductive paste. Next, a trimming of the capacitance is performed by utilizing a trimming means like a diamond cutter, sandblast, or laser beam. The trimming of the capacitance is carried out by cutting or trimming the outer electrode 8 so that the oscillating frequency of the oscillator becomes the desired frequency. The trimming is first carried out for the coarse adjustment portion of the electrode so that the oscillating frequency becomes approximately equal to the desired frequency, and then the fine trimming is carried out by the fine adjustment portion so that the oscillating frequency becomes equal precisely to the desired frequency.

When the trimming of the capacitor is finished, the capacitor operates as a fixed capacitor the capacitance of which is stable and does not change by the external disturbances. Therefore, the reliability and/or the stability of the oscillating frequency of the oscillator is greatly improved, and thus, an improved watch and/or clock is obtained.

The present capacitor which is to be trimmed has the advantage over a prior rotational capacitor that the structure of the capacitor can be thinner than a prior capacitor, therefore, the oscillator can be miniaturized, and/or the density of the electronic components of a watch and/or a clock can be improved.

According to the embodiment, the size of the trimming capacitor is 2.5 mm×2.0 mm or 2.5 mm×1.5 mm, and the thickness of the capacitor is in the range from 0.4 mm to 0.6 mm.

Figure 8:
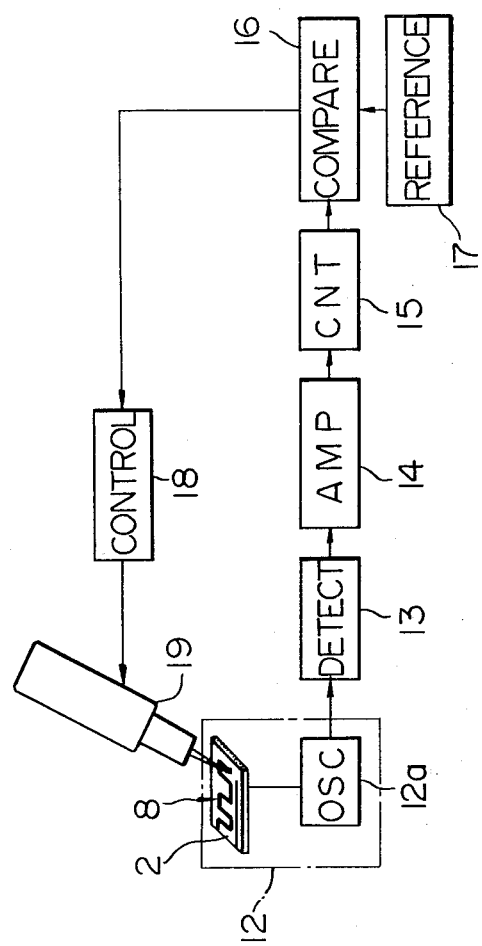
FIG. 8 is the block diagram of the apparatus for trimming the capacitor according to the present invention.

FIG. 8 shows the block-diagram of the first embodiment of the apparatus for trimming the capacitor according to the present invention, and this embodiment performs only the coarse adjustment of the capacitor. In the figure, the reference numeral 12 is the quartz-crystal oscillation circuit shown in FIG. 1. The oscillation circuit 12 has the trimming capacitor 2 having the outer trimming electrode 8, and a semiconductor electronic circuit 12a. 13 is the signal detector which is for instance a microphone arranged near the oscillator for converting the acoustic sound energy from the quartz-crystal piece to the electric signal. 14 is a pre-amplifier for the amplification of the output of the detector 13. 15 is a pulse counter for measuring the frequency of the oscillator circuit 12 through the signal detector 12 and the pre-amplifier 13. 16 is a frequency comparator, and 17 is the reference frequency oscillator. The output frequency of the reference oscillator 17 is, in case of a wrist watch, 32.768 kHz or 4.0000 MHz. 18 is a trimming unit controller, and 19 is a trimming unit for cutting or trimming the trimming electrode of a trimming capacitor.

A conventional trimming unit, for instance, a model MT-110 series condenser trimmer, manufactured by Comco Inc. 9421 Telfair Ave./Sun Valley, Calif. 91352, U.S.A. can be utilized as the trimming unit 19.

The operation of the apparatus in FIG. 8 is as follows.

The oscillating frequency which depends upon the capacitance of the capacitor 2 or the area of the outer electrode 8 is detected acoustically by the signal detector 13, the output of which is applied to the pulse counter 15 through the pre-amplifier 14. The output of the counter 15, which is the number of pulses in a predetermined duration and is the measured frequency, is applied to the frequency comparator 16, which also receives the reference frequency from the reference frequency oscillator 17. When the frequency from the counter 15 does not coincide with the frequency from the oscillator 17, the comparator provides the trimming output signal, which is applied to the trimming unit 19 through the trimming unit controller 18. The controller 18 controls the ON/OFF operation of the trimming unit 19 by providing the necessary voltage or the current to the trimming unit 19. When the trimming unit 19 trims or cuts the outer electrode 8a and/or 8b of the capacitor 2, the capacitance of the capacitor 2 changes, then, the oscillating frequency of the oscillator changes. As the trimming of the outer electrode 8 proceeds, the oscillating frequency of the circuit 12 will reach the reference frequency of the reference oscillator 17, and the frequency comparator 16 provides the coincidence output, which stops the operation of the trimming unit 19.

Some modifications or the alternatives of the apparatus in FIG. 8 are possible to those skilled in the art. For instance, the frequency comparison can be performed utilizing an analog technique instead of the digital technique of FIG. 8. In an analog technique, the counter 15 and the frequency comparator 16 are replaced with a phase comparator.

Figure 9:
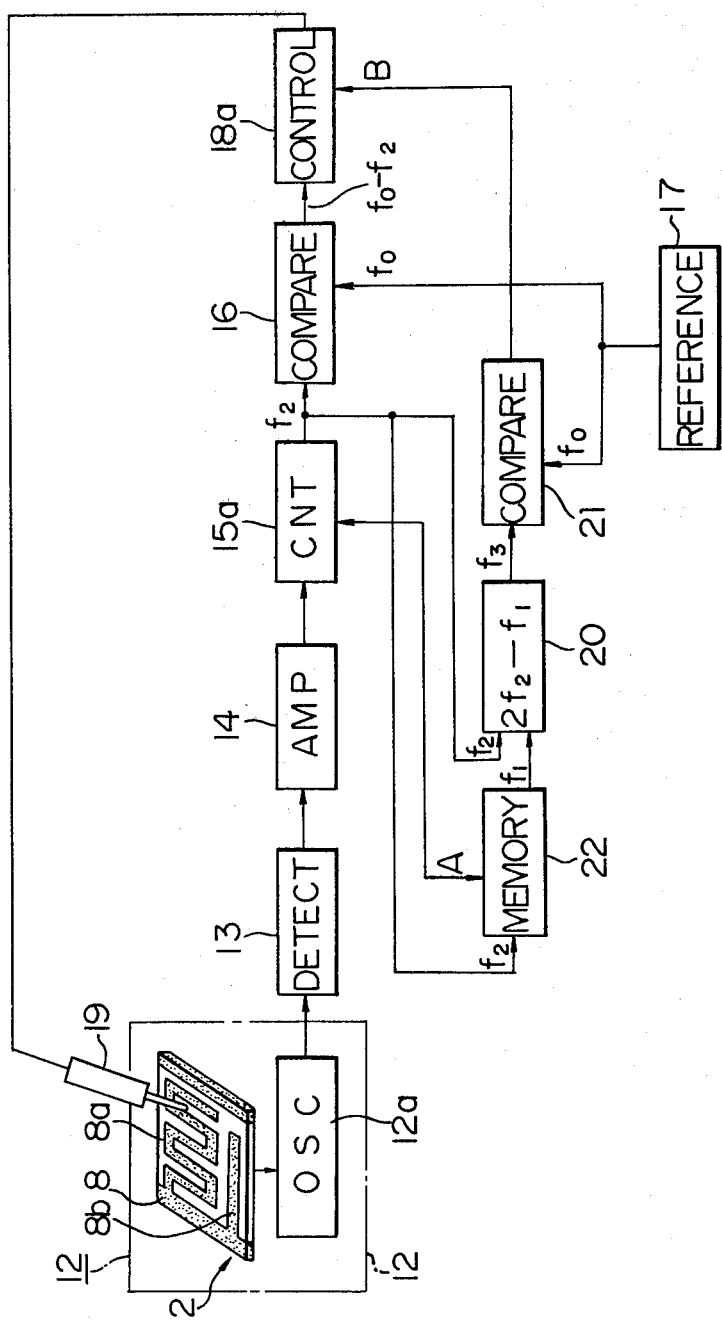
FIG. 9 is the block diagram of another embodiment of the apparatus for trimming the capacitor.
Figure 10:
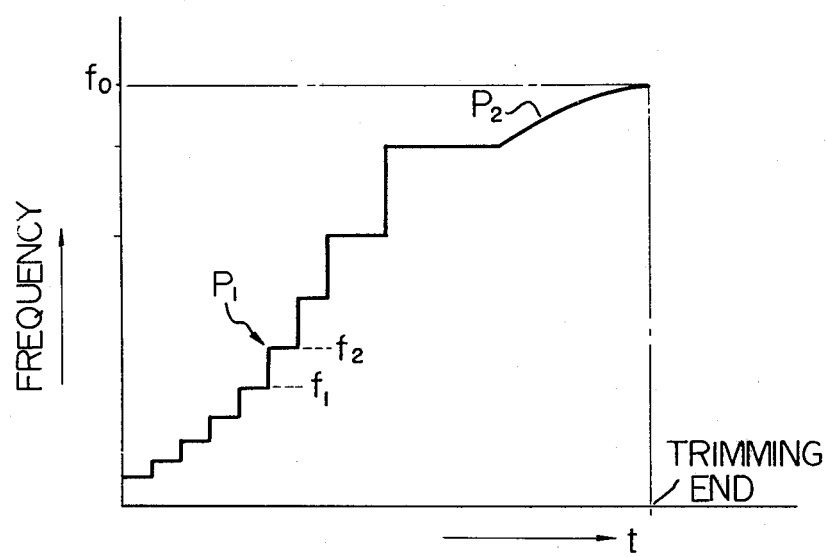
FIG. 10(A), FIG. 10(B) and FIG. 10(C) are the explanatory drawings for the operation of the apparatus shown in FIG. 8.
Figure 10:
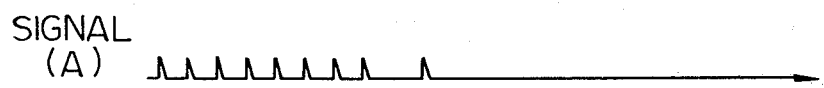
Figure 10:

FIG. 9 shows the block diagram of another apparatus for the trimming of a capacitor according to the present invention. And FIGS. 10A, 10B and 10C show the operation of the apparatus in FIG. 9. In FIG. 9, the reference numerals 2, 8, 8a, 8b, 12, 12a, 13, 14 show the same members as those of the corresponding members in FIG. 8. The reference numeral 15a is a counter which measures the frequency of the oscillator 12 through the signal detector 13 and the pre-amplifier 14, and provides the measured frequency $f_2$ in a digital form. The counter 15a also provides the signal (A) when the measured frequency changes stepwise. In this case it should be noted that the coarse trimming is performed by cutting the coarse adjustment portion 8a by the predetermined length, and therefore, the oscillating frequency changes stepwise when each trimming is carried out. Accordingly, the oscillating frequency is shown by the curve $P_1$ in FIG. 10A, where the horizontal axis shows the time that the trimming is carried out, and the vertical axis shows the oscillating frequency of the oscillator 12. And FIG. 10B shows the timing of the signal (A) which is provided by the counter 15a when the frequency of the curve $P_1$ in FIG. 10A changes stepwise. The reference numeral 16 is a first frequency comparator, and 17 is the reference frequency oscillator which provides for instance 32.768 kHz or 4.000 MHz. The frequency comparator 16 compares the frequency $f_2$ from the counter 15a with the reference frequency $f_0$ from the reference frequency oscillator 17, and provides the difference between $f_0$ and $f_2$ in a digital form. The information that said difference exists is applied to the trimming unit 19 through the trimming unit controller 18a, and the trimming unit 19 trims the outer electrode 8a by cutting the predetermined length of the electrode 8a. As mentioned before, upon each coarse trimming, the oscillating frequency $f_2$ changes stepwise as shown by the curve $P_1$ in FIG. 10A since the predetermined length of the coarse adjustment portion 8a is removed in each trimming, and the signal (A) is output from the counter 15a as shown in FIG. 10B.

In FIG. 9, the reference numeral 20 is a calculator, 21 is the second frequency comparator, and 22 is a digital memory, and those members 20, 21 and 22 are mounted in order to provide a trigger signal (B) to change the coarse trimming mode to a fine trimming mode.

When the counter 15a provides the output trigger signal (A), the memory 22 provides the output frequency $f_1$ which is the frequency in the preceding step stored in said memory 22, and stores the digital value $f_2$ from the counter 15a. The preceding frequency $f_1$ from the memory 22 and the present frequency $f_2$ from the counter 15a are applied to the inputs of the calculator 20, which performs the predetermined calculation, for instance $$f_3 = 2f_2 - f_1$$

The result $f_3$ of the calculation is applied to the second frequency comparator 21, which also receives the reference frequency $f_0$ from the reference frequency oscillator 17. And said frequency $f_3$ is compared with the reference frequency $f_0$ by the second comparator 21. Then, when the difference between $f_3$ and $f_0$ is less than the predetermined value, the second comparator 21 provides the trigger signal (B) to the trimming unit control 18a as shown in FIG. 10C in order to change the coarse trimming mode to the fine trimming mode.

When said trigger signal (B) is provided, the trimming unit controller 18a controls the trimming unit 19 so that the trimming unit 19 trims the fine adjustment portion 8b instead of the coarse adjustment portion 8a, thus, the following trimming operation is performed by trimming the fine adjustment portion 8b, and the oscillating frequency of the oscillator 12 changes according to the curve $P_2$ in FIG. 10A. The curve $P_2$ or the oscillating frequency asymptotes to the goal frequency $f_0$, and when the oscillating frequency of the oscillator 12 reaches within the allowable range of the goal frequency, the trimming unit control 18a provides the stop signal, and then the trimming operation stops automatically.

As explained above, the timing of the trigger signal (B) depends upon the calculator 20. In the embodiment, the calculator provides the calculation;

$$f_3 = 2f_2 - f_1$$

In that case, the trigger signal (B) is provided when $f_3 \geq f_0$ is satisfied (that is to say, $f_2 \geq (f_1 + f_0)/2$, $f_2 < f_0$ is satisfied).

When the trimming is finished, the error of the oscillating frequency of the quartz-crystal piece is less than $10^{-6}$, and preferably it is less than $10^{-7}$.

Finally, some effects of the present invention are enumerated as follows.

(a) Since a trimmer capacitor is a fixed capacitor, the capacitance is more stable than that of a prior rotation type trimmer capacitor, and so the more accurate oscillating circuit is provided.

(b) The size of capacitor is smaller than a prior rotation type capacitor, and so a smaller oscillator and/or a smaller watch is obtained.

(c) The trimming of the capacitance or the oscillating frequency can be performed automatically by cutting the outer electrode of a capacitor, and so the adjustment of the frequency can be carried out in a short time with improved accuracy.

(d) Since the trimming is performed by the coarse trimming and the fine trimming, the resulting capacitance or frequency is sufficiently accurate.

From the foregoing it will now be apparent that a new and improved capacitor trimming system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A trimming system for a quartz-crystal oscillator comprising:
   (a) an oscillation circuit including a quartz-crystal piece, a trimmer capacitor coupled to said quartz-crystal piece for adjusting the oscillating frequency of the quartz-crystal piece, and a semiconductor electronic circuit coupled to said quartz-crystal piece for operating said quartz-crystal piece;
   (b) said trimmer capacitor having at least a fixed outer trimming electrode, a common inner electrode fixed parallel to said trimming electrode and dielectric body sandwiched between said two electrodes, at least said trimming electrode being exposed for enabling the trimming of the area of the trimming electrode, said trimming electrode having a coarse adjustment portion parallel and aligned with said common electrode and a fine adjustment portion positioned in the same plane as the coarse adjustment portion but outside of said common electrode,
   (c) a signal detector coupled acoustically with said quartz-crystal piece for providing an electrical signal relating to the oscillation of said quartz-crystal piece,
   (d) a counter means connected to the output of said signal detector through an amplifier for measuring the oscillating frequency of said quartz-crystal piece,
   (e) a reference frequency oscillator for providing the desired reference frequency,
   (f) a comparator coupled to said counter and said reference frequency oscillator, for comparing the frequency of said quartz-crystal oscillator measured by said counter means with the output frequency of said reference frequency oscillator,
   (g) a trimming unit operably coupled to said trimmer capacitor, for trimming the area of said trimming electrode of said trimmer capacitor,
   (h) a memory means coupled to said counter means for storing the frequency $f_1$ measured by said counter means in the preceding trimming step,
   (i) a calculation means coupled to said memory means, for providing the difference $f_3$ between the twice ($2f_2$) of the frequency measured by said counter means at the present step and the output ($f_1$) of said memory means,
   (j) a second comparator coupled to said calculation means and said reference frequency oscillator, for comparing the output ($f_3$) of said calculation means with the output frequency ($f_0$) of the reference frequency oscillator, and providing a trigger signal when $f_3$ is equal to or larger than $f_0$, and
   (k) a trimming unit control operably coupled to said trimming unit, for controlling the operation of said trimming unit according to the output of said comparator, said trimming unit control being arranged to control the trimming unit so that the coarse adjustment portion of said trimming electrode is initially trimmed and when said second comparator provides the trigger signal thereto, the fine adjustment portion of said trimming electrode is trimmed until the oscillation frequency of said quartz-crystal piece reaches the reference frequency.

2. A trimming system according to claim 1, wherein the pattern of said coarse adjustment portion of said trimming electrode is a folded linear line with a width ($d_2$), the pattern of said fine adjustment portion of the trimming electrode is a linear with a width ($d_1$), wherein $d_2$ is larger than $d_1$.

3. A trimming system according to claim 2, wherein the capacitance of the trimmer capacitor is in the range from 5 pF to 35 pF.

4. A trimmer capacitor comprising at least a fixed outer trimming electrode, a common inner electrode fixed parallel to said trimming electrode and a dielectric body sandwiched between said two electrodes, at least said trimming electrode being disposed in the air for enabling the trimming of the area of the trimming electrode, said trimming electrode having a coarse adjustment portion parallel and aligned with said common electrode and a fine adjustment portion attached to the same plane as that of the coarse adjustment portion but the outside portion of said common electrode, the pattern of said coarse adjustment portion of said electrode is a folded linear line with the width ($d_2$), the pattern of said fine adjustment portion of the trimming electrode is a linear line with the width ($d_1$), and $d_2$ is larger than $d_2$.

* * * * *